(12) United States Patent
Watanabe et al.

(10) Patent No.: US 8,575,677 B2
(45) Date of Patent: Nov. 5, 2013

(54) SEMICONDUCTOR DEVICE AND ITS MANUFACTURING METHOD

(75) Inventors: Heiji Watanabe, Minato-ku (JP); Kazuhiko Endo, Minato-ku (JP); Kenzo Manabe, Minato-ku (JP)

(73) Assignee: Renesas Electronics Corporation, Kanagawa (JP)

( * ) Notice: Subject to any disclaimer, the term of this patent is extended or adjusted under 35 U.S.C. 154(b) by 42 days.

(21) Appl. No.: 13/353,089

(22) Filed: Jan. 18, 2012

(65) Prior Publication Data

US 2012/0181632 A1 Jul. 19, 2012

Related U.S. Application Data

(63) Continuation of application No. 10/519,084, filed as application No. PCT/JP03/07761 on Jun. 19, 2003, now Pat. No. 8,125,016.

(30) Foreign Application Priority Data

Jun. 27, 2002 (JP) ................................. 2002-187596

(51) Int. Cl.
*H01L 27/115* (2006.01)
*H01L 21/84* (2006.01)

(52) U.S. Cl.
USPC ...... 257/315; 257/369; 257/80; 257/E21.703; 257/E27.013; 257/E27.112

(58) Field of Classification Search
USPC ............ 257/410–412, E21.01, E21.274, 315, 257/369, 80, E21.703, E27.103, E27.112; 438/287, 591, 785
See application file for complete search history.

(56) References Cited

U.S. PATENT DOCUMENTS 6,033,998 A 3/2000 Aronowitz et al.
6,130,155 A * 10/2000 Chen et al. ..................... 438/635
(Continued)

FOREIGN PATENT DOCUMENTS

JP 10-242461 A 9/1998
JP 11-261067 A 9/1999
(Continued)

OTHER PUBLICATIONS

Chinese Office Action dated Jan. 12, 2007 for Chinese Patent Application No. 03815014X.

(Continued)

*Primary Examiner* — Zandra Smith
*Assistant Examiner* — Tsz Chiu
(74) *Attorney, Agent, or Firm* — Sughrue Mion, PLLC

(57) ABSTRACT

A semiconductor device having, on a silicon substrate, a gate insulating film and a gate electrode in this order; wherein the gate insulating film comprises a nitrogen containing high-dielectric-constant insulating film which has a structure in which nitrogen is introduced into metal oxide or metal silicate; and the nitrogen concentration in the nitrogen containing high-dielectric-constant insulating film has a distribution in the direction of the film thickness; and a position at which the nitrogen concentration in the nitrogen containing high-dielectric-constant insulating film reaches the maximum in the direction of the film thickness is present in a region at a distance from the silicon substrate. A method of manufacturing a semiconductor device including introducing nitrogen by irradiating the high-dielectric-constant insulating film which is made of metal oxide or metal silicate, with a nitrogen containing plasma, is also provided.

9 Claims, 7 Drawing Sheets

(56) References Cited

U.S. PATENT DOCUMENTS

| | | |
|---|---|---|
| 6,136,654 A | 10/2000 | Kraft et al. |
| 6,165,849 A | 12/2000 | An et al. |
| 6,184,072 B1 * | 2/2001 | Kaushik et al. ............... 438/197 |
| 6,187,674 B1 * | 2/2001 | Chen et al. .................... 438/653 |
| 6,225,168 B1 * | 5/2001 | Gardner et al. ............... 438/287 |
| 6,365,467 B1 | 4/2002 | Joo |
| 6,380,104 B1 | 4/2002 | Yu |
| 7,157,359 B2 | 1/2007 | Park et al. |
| 2002/0153579 A1 | 10/2002 | Yamamoto |
| 2002/0195643 A1 | 12/2002 | Harada |
| 2003/0089942 A1 | 5/2003 | Bhattacharyya |

FOREIGN PATENT DOCUMENTS

| | | |
|---|---|---|
| JP | 2000-3885 A | 1/2000 |
| JP | 2000-195856 A | 7/2000 |
| JP | 2001-85427 A | 3/2001 |
| JP | 2001-257344 A | 9/2001 |
| JP | 2001-332547 A | 11/2001 |
| JP | 2001-358225 A | 12/2001 |
| JP | 2002-60944 A | 2/2002 |
| JP | 2002-164343 A | 6/2002 |
| JP | 2002-299607 A | 10/2002 |
| JP | 2003-8005 A | 1/2003 |
| JP | 2003-282873 A | 10/2003 |
| JP | 2005-534163 A | 11/2005 |

OTHER PUBLICATIONS

H.-J. Cho, et al.: "Novel Nitrogen Profile Engineering for Improved TaN/HfO2/Si MOSFET Performance"; International Electron Devices Meeting;, Technical Digest 2001, pp. 655-658.

Hag-Ju Cho, et al.; "Structural and Electrical Properties of HfO2 With Top Nitrogen Incorporated Layer"; IEEE Electron Device Letters; vol. 23 No. 5, May 2002; pp. 249-251.

Hyungsuk Jung et al., Electrical and Reliability Characteristics of a n Ultrastjom TaOxNy Gate Dielectric Prepared by ND3 Annealing of Ta2O5, IEEE Electron Device Letters, Dec. 2000, vol. 21, No. 12, pp. 563-565.

International Search Report dated Sep. 30, 2003 for International Application No. PCT/JP03/07761.

Japanese Office Action dated Jun. 27, 2007 for Japanese Patent Application No. 2002-187596.

M. Koyama, et al.; "Thermally Stable Ultra-Thin Nitrogen Incorporated ZrO2 Gate Dielectric Prepared by Low Temperature Oxidation of ZrN"; Tech. Dig. IEDM 2001; pp. 459-462.

* cited by examiner (a)

(b)

(c)

SEMICONDUCTOR DEVICE AND ITS MANUFACTURING METHOD

This is a Continuation of U.S. application Ser. No. 10/519,084 filed Dec. 23, 2004, which is based on 371 National Stage Application No. PCT/JP03/07761 filed on Jun. 19, 2003, which claims priority from Japanese Patent Application No. 2002-187596 filed on Jun. 27, 2002, the disclosure of which are incorporated herein by reference in its entirety.

BACKGROUND OF THE INVENTION

1. Field of the Invention

The present invention relates to a semiconductor device having a high-dielectric-constant thin film and a manufacturing method thereof, and more particularly to an art making a gate insulating film that constitutes a MOSFET (Metal Oxide Semiconductor Field Effect Transistor) attain higher performance and lower power consumption.

2. Description of the Related Art

As a material for the gate insulating film of the MOSFET, the silicon oxide film is in wide use having an excellent process stability and a high insulation capability. Meanwhile, along with the current miniaturization, the thickness of the gate insulating film has been decreasing, and in the device whose gate length is 100 nm or less, it has become essential under scaling low that the film thickness of the silicon oxide film which serves as a gate insulating film is 1.5 nm or less. Yet, when such an extra thin insulating film is utilized, the tunneling current through the insulating layer, in applying the gate bias, becomes substantial in comparison with the source/drain current, which leads to a serious adverse effects on attempts to attain higher performance and lower power consumption for the MOSFET.

Another problem to accompany the reduction of the thickness of the gate insulating film is the diffusion of the dopants from the gate electrode (the polysilicon electrode). The gate electrode used in the MOSFET, in general, acquires its metallic properties through the high concentration doping which is applied to the polysilicon grown on the gate insulating film, and, thus, when the silicon oxide film is very thin, there arises a problem that the dopants may diffuse from the gate electrode to the silicon substrate side, passing through the insulating film layer.

In order to solve the above problems of the increase in leakage current and the penetration of the dopants that are brought about by the reduction of the film thickness of the gate insulating film, various techniques have been being developed. One of such techniques is a method in which by adding nitrogen to the silicon oxide film, the dielectric constant of the film is made higher than that of the pure silicon oxide film and thereby the effective (electrical) film thickness of the gate insulating film is made lessened without reducing its physical film thickness. Since it was, furthermore, confirmed that the nitrogen addition also suppresses the diffusion of dopants within the insulating film, and, therefore, the technique of the nitrogen addition to the gate insulating film has been drawing considerable attention as a highly promising technique capable to solve the two problems mentioned above. However, this technique has, as pointed out, disadvantages that the nitrogen addition to the silicon oxide film can only raise its dielectric constant up to a certain value and besides nitrogen may cause the interfacial defects and the fixed charge generation in the film, resulting in the poor mobility as well as the lower reliability of the transistor.

In consequence, the investigations are under way to find a material having a dielectric constant higher than those of the silicon oxynitride film and the silicon nitride film as well as an preventive effect on the dopant diffusion to replace the silicon oxide film as the next generation material of the gate insulating film. Firstly, among materials having a high dielectric constant, $Al_2O_3$, $ZrO_2$, $HfO_2$, rare-earth element oxides such as $Y_2O_3$, and lanthanoid type rare-earth element oxides such as $La_2O_3$ and, in addition, thin films of silicate of these substances are being examined as candidates for such a material.

This is based on an idea that even if the gate length becomes minute, the use of a high-dielectric-constant film of this sort makes it possible to prevent the tunneling current well with a film thickness the scaling law allows to have, while maintaining the capacitance of the gate insulating film at the same time.

Now, for any type of the gate insulating film, the film thickness of the insulating layer obtained by the reverse calculation from the gate capacitance under the assumption that the material of the gate insulating film is a silicon oxide film is called the film thickness in terms of the silicon oxide film thickness. That is, when the dielectric constants of the insulating film and the silicon oxide film are taken to be $\in_h$ and $\in_o$, respectively, and the thickness of the insulating film is taken to be dh, the film thickness in terms of the silicon oxide film thickness de becomes de=dh ($\in_o/\in_h$). This implies, in other words, that, with the material having a dielectric constant $\in_h$ that is larger than $\in_o$ the insulating film with a certain thickness may become equivalent to a thin silicon oxide film. As the dielectric constant $\in_o$ of the silicon oxide film is 3.9 or so, if a high-dielectric-constant film, for example, with $\in_h=39$ is used, the film 15 nm thick has a film thickness of 1.5 nm in terms of the silicon oxide film thickness so that this film can heavily reduce the tunneling current.

As described above, in developing the next generation MOSFET, various high-dielectric-constant films are, as the gate insulating film material, being examined for use, and the afore-mentioned metal oxide thin films and silicate thin films are regarded as strong candidates for the high-dielectric-constant film. Nevertheless, even these high-dielectric-constant films have been shown to have the following problems.

Firstly, the thermal stability of the high-dielectric-constant film is itself a problem. Namely, it has been reported that, in the step of conducting the heat treatment to activate dopants implanted in the gate electrode, the afore-mentioned gate material with a high dielectric constant becomes crystallized or the interfacial reaction with the silicon substrate proceeds. When crystallization of the high-dielectric-constant film takes place, with the boundary (grain boundary) appearing among grains, the insulation characteristics on these grain boundaries deteriorate and the film thickness within a plane becomes non-uniform due to crystallization is brought about. As the means of overcoming this problem of crystallization, it is effective to select a high-dielectric-constant material with a high thermal stability, in the first place, and besides apply the nitrogen addition to the metal oxide or silicate film. Meanwhile, oxygen in the vapor phase readily diffuses into the high-dielectric-constant film so that a reactive layer may be disadvantageously formed on the interface with the silicon substrate at the time of the film growth and the subsequent heat treatment.

In regard to this problem, a structure in which a very thin (normally 0.5 nm to 1 nm or so thick) silicon oxide film is inserted on the interface between a high-dielectric-constant film and a silicon substrate is being examined. Moreover, a recent report indicated that a silicon oxynitride film can be used as the afore-mentioned interfacial insertion layer with effect.

As the second problem for the high-dielectric-constant gate insulating film, similar to the silicon oxide film, deterioration of the device characteristics thereof due to the dopant penetration is well known. While seriousness of this problem varies with the material type of the insulating film, and, moreover, the physical film thickness for the high-dielectric-constant gate insulating film can be set thicker than that for the silicon oxide film, if the diffusion rate of the dopants in the film is high and a polysilicon gate electrode or polysilicon germanium electrode is utilized, this problem becomes a fatal one. Nevertheless, the recent investigation demonstrated that nitrogen addition to $Al_2O_3$ or $ZrO_2$ can suppress the dopant diffusion well.

For the third problem, there is pointed out deterioration of electric characteristics of the interface between a high-dielectric-constant thin film and a silicon substrate. Compared with the interface of the conventional silicon oxide film, the interface of the high-dielectric-constant thin film has a higher interfacial defect density of, in general, not less than $10^{11}/cm^2$, which is liable to cause the following problems. These interfacial defects (or defects within the film) worsen the MOSFET mobility in such a way that it may become even less than a quarter of that with the silicon oxide film. Further, the presence of fixed charges in the film and on its interface disadvantageously varies the threshold of the transistor operations. For a remedy of these problems, like the remedy of the first problem, the insertion of a silicon oxide film is effective. However, if the interfacial silicon oxide film layer is thick, the film thickness of the whole gate insulating film in terms of the silicon oxide film thickness increases a great deal. On the other hand, if the interfacial oxide film layer is thin, satisfactory interfacial thermal stability or sufficient preventive effects on the dopant penetration cannot be obtained. Furthermore, although the structure in which an extra thin silicon oxynitride film or silicon nitride film is inserted on the interface between a high-dielectric-constant film and a silicon substrate is effective for the improvement on the interfacial thermal stability and suppression of the dopant penetration, deterioration of electric characteristics remains. This can be attributed to the interfacial defects caused by the additional presence of nitrogen and, in comparison with the conventional interface of the silicon/silicon oxide films, more deterioration of the mobility and reliability is brought about.

As described above, although the first and the second problems can be successfully overcome by making nitrogen contained in the high-dielectric-constant gate insulating film, once inside, the presence of the nitrogen on the interface with the silicon substrate has adverse effects. In making nitrogen contained in the silicon oxide film, if the sample is subjected to a heat treatment in the atmosphere of a nitrogen containing gas such as $NH_3$ or NO gas, nitrogen can be introduced into the film, but a large amount of segregated nitrogen tends to be left on the interface with the silicon substrate, which causes the lowering of the mobility and the deterioration of the reliability as described for the third problem. Further, for the high-dielectric-constant insulating film, too, nitrogen can be introduced into the film by annealing that in the atmosphere of a nitrogen containing gas, but, in this case, too, a possibility of a similar problem of nitrogen segregation on the interface with the silicon substrate cannot be ruled out.

As another method of introducing nitrogen into a high-dielectric-constant thin film, there is proposed to use the step of applying an oxidation treatment to a metal nitride film (Koyama et al., Tech. Dig. IEDM. 2001, p. 459). In short, a ZrN film is grown on the surface of a silicon substrate by the sputtering method, and by applying an oxidation treatment thereto at 500° C., nitrogen is added into $ZrO_2$ and thereby a better thermal stability than the conventional $ZrO_2$ film can be provided. However, in this method, when ZrN is grown as well as when the oxidation treatment is conducted, a SiON layer containing nitrogen at a high concentration is formed on the interface with the silicon substrate so that this method either cannot bring a thorough solution for the third problem described above.

SUMMARY OF THE INVENTION

An object of the present invention is to provide a semiconductor device having a gate insulating film structure capable to operate simultaneously measures which are, in applying the high-dielectric-constant gate insulating film to the device, devised to improve the afore-mentioned thermal stability, suppression of the dopant penetration and interfacial electric characteristics and a manufacturing method thereof.

Figure 1:
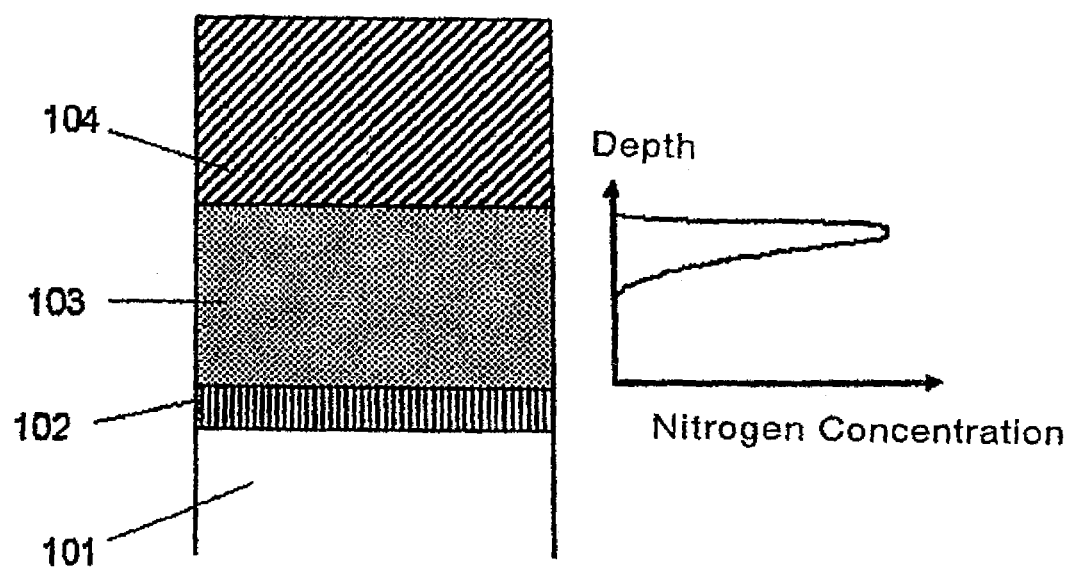
FIG. 1 is a schematic view showing one embodiment of a semiconductor device according to the present invention.

Referential numerals used in the drawings are described below.

Referential numeral 101 indicates a silicon substrate; referential numeral 102, a silicon oxide film (an interfacial oxide film layer); referential numeral 103, a nitrogen containing high-dielectric-constant insulating film; referential numeral 104, agate electrode; referential numeral 201, a silicon substrate; referential numeral 202, a hydrogen terminal surface; referential numeral 203, a silicon oxide film; referential numeral 204, a metal layer; referential numeral 205, a nitrogen containing layer; referential numeral 206, a nitrogen containing high-dielectric-constant insulating film; referential numeral 301, a silicon substrate; referential numeral 302, a silicon oxide film; referential numeral 303, a nitrogen containing high-dielectric-constant insulating film; referential numeral 304, a gate electrode; referential numeral 601, a silicon substrate; referential numeral 602, a hydrogen terminal surface; referential numeral 603, a silicon oxide film; referential numeral 604, a metal Zr deposition layer; referential numeral 605, a Zr deposition layer; referential numeral 606, a nitrogen containing high-dielectric-constant insulating film; referential numeral 701, a silicon substrate; referential numeral 702, a hydrogen terminal surface; referential numeral 703, a silicon oxide film; referential numeral 704, a HfSi deposition layer; referential numeral 705, a silicon nitride film; referential numeral 706, a nitrogen containing high-dielectric-constant insulating film (a nitrogen containing Hf silicate layer).

DETAILED DESCRIPTION OF THE INVENTION AND PREFERRED EMBODIMENTS

The present invention provides, as a first embodiment, a semiconductor device stacked a gate insulating film and a gate electrode in this order on a silicon substrate; wherein said gate insulating film comprises a nitrogen containing high-dielectric-constant insulating film which has a structure in which nitrogen is introduced into metal oxide or metal silicate; and the nitrogen concentration in said nitrogen containing high-dielectric-constant insulating film has a distribution in the direction of the film thickness; and a position at which the nitrogen concentration in said nitrogen containing high-dielectric-constant insulating film reaches a maximum in the direction of the film thickness is present in a region at a distance from the silicon substrate.

It is favorable that in this semiconductor device, a position at which the nitrogen concentration in said nitrogen containing high-dielectric-constant insulating film reaches a maximum in the direction of the film thickness is present in a region at a distance of not less than 0.5 nm from the silicon substrate.

Further, it is also favorable that a position at which the nitrogen concentration in said nitrogen containing high-dielectric-constant insulating film reaches a maximum in the direction of the film thickness is localized on the side of a gate electrode in said nitrogen containing high-dielectric-constant insulating film.

It is also favorable that a position at which the nitrogen concentration in said nitrogen containing high-dielectric-constant insulating film reaches a maximum in the direction of the film thickness is localized in the central section of said nitrogen containing high-dielectric-constant insulating film.

The nitrogen concentration on a silicon substrate side interface of said gate insulating film is favorably less than 3 atomic %.

The present invention provides, as a second embodiment, a semiconductor device stacked a gate insulating film and a gate electrode in this order on a silicon substrate; wherein said gate insulating film comprises a nitrogen containing high-dielectric-constant insulating film which has a structure in which nitrogen is introduced into metal silicate; and a nitrogen atom in said nitrogen containing high-dielectric-constant insulating film selectively bonds with a silicon atom in metal silicate.

It is favorable that, in this semiconductor device, a nitrogen atom which selectively bonds with a silicon atom in said metal silicate is situated at a distance from the silicon substrate.

It is favorable, in this semiconductor, said gate insulating film comprises a silicon oxide film formed on said silicon substrate so as to be in contact therewith, and said nitrogen containing high-dielectric-constant insulating film formed on said silicon oxide film so as to be in contact therewith.

The present invention provides, as a third embodiment, a semiconductor device stacked a gate insulating film and a gate electrode in this order on a silicon substrate; wherein said gate insulating film comprises a nitrogen containing high-dielectric-constant insulating film which has a structure in which nitrogen is introduced into metal silicate; and the composition of said nitrogen containing high-dielectric-constant insulating film continuously varies in the direction of the film thickness and the silicon concentration has a minimum value in the middle section lying between a silicon substrate side interface of said nitrogen containing high-dielectric-constant insulating film and a gate electrode side interface thereof; and nitrogen is introduced only into a region lying between the position at which the silicon concentration has the minimum value and said gate electrode side interface.

The present invention provides, as a fourth embodiment, a semiconductor device stacked a gate insulating film and a gate electrode in this order on a silicon substrate; wherein said gate insulating film has a layered structure having, from the silicon substrate side, a first silicon oxide film, a metal oxide film or a metal silicate film and a second silicon oxide film; and only the second silicon oxide film has a structure in which nitrogen is introduced into silicon oxide.

It is favorable that, in the above semiconductor device, said silicon substrate and said gate insulating film are in contact with each other, and said gate insulating film and a gate electrode are in contact with each other; and said gate electrode is made of either a polysilicon or a polysilicon germanium conductive film.

It is favorable that, in the above semiconductor device, said gate insulating film contains at least one type selected from the group consisting of Zr, Hf, Ta, Al, Ti, Nb, Sc, Y, La, Ce, Pr, Nd, Sm, Eu, Gd, Tb, Dy, Ho, Er, Tm, Yb and Lu.

Further, the present invention provides a method of manufacturing a semiconductor device stacked a gate insulating film and a gate electrode in this order on a silicon substrate; wherein said semiconductor device is a semiconductor device of the afore-mentioned first, second and third embodiment: which comprises the step of making said introduction of nitrogen by irradiating said high-dielectric constant insulating film which is made of metal oxide or metal silicate, with a nitrogen containing plasma.

The present invention provides a method of manufacturing a semiconductor device stacked a gate insulating film and a gate electrode in this order on a silicon substrate; wherein said semiconductor device is a semiconductor device of the afore-mentioned fourth embodiment: which comprises the step of making said introduction of nitrogen by irradiating said layered structure with a nitrogen containing plasma.

The present invention provides a method of manufacturing a semiconductor device stacked a gate insulating film and a gate electrode in this order on a silicon substrate; wherein said semiconductor device is a semiconductor device of the afore-mentioned second embodiment; which comprises the step of irradiating said high-dielectric constant insulating film which is made of metal silicate, with a nitrogen containing plasma, so as to form, selectively, bonds between silicon and nitrogen in metal silicate, and thereby making said introduction of nitrogen.

The present invention provides a method of manufacturing a semiconductor device stacked a gate insulating film and a gate electrode in this order on a silicon substrate; wherein said semiconductor device is a semiconductor device of the afore-mentioned first, second or third embodiment, which comprises the step of forming, on the silicon substrate, a layered structure made of a metal layer and a nitrogen containing layer that contains nitrogen, and thereafter applying an oxidation treatment to form a gate insulating film.

It is favorable that, in this manufacturing method, said nitrogen containing layer is one of a silicon oxynitride film and a silicon nitride film.

Further, it is also favorable that, in this manufacturing method, said nitrogen containing layer is a metal nitride film.

Further, it is also favorable that, in this manufacturing method, said layered structure is formed after a silicon oxide film with a film thickness of less than 1 nm is formed on the surface of the silicon substrate.

Further, the present invention provides a semiconductor device stacked a gate insulating film and a gate electrode in this order on a silicon substrate; wherein said gate insulating film contains nitrogen and metal oxide or metal silicate; and the nitrogen concentration in said gate insulating film has a distribution in the direction of the film thickness; and a position at which the nitrogen concentration in said gate insulating film reaches a maximum in the direction of the film thickness is present in a region at a distance from the silicon substrate.

The present invention sets forth a gate insulating film structure wherein a position at which the nitrogen concentration in the high-dielectric-constant insulating film reaches the maximum is preferably set at a distance of not less than 0.5 nm from the silicon substrate interface, and the nitrogen concentration on the interface between the high-dielectric-constant gate insulating film and the silicon substrate is preferably set as low as less than 3%. Further, in a manufacturing method to attain the present gate insulating film structure, the control on the nitrogen distribution in the gate insulating film may be achieved by comprising the step of nitriding selectively a region other than the vicinity of the silicon substrate through the exposure to a nitrogen containing plasma or the step of forming, on the silicon substrate, a layered structure composed of a metal layer and a nitrogen containing layer, and thereafter applying an oxidation treatment thereto.

The high dielectric constant as used herein means the dielectric constant higher than that of the silicon nitride film. In practice, from the viewpoint of making the film thickness in terms of the silicon oxide film thickness thin, the dielectric constant of the high-dielectric-constant gate insulating film is set to be preferably not less than 8 and more preferably not less than 10. However, when alumina is utilized as metal oxide, it is sufficient to set not less than 7.

A semiconductor device having a typical high-dielectric-constant gate insulating film structure in accordance with the present invention is shown in FIG. 1. Herein, the description is made, taking, as an example, a gate insulating film structure composed of a nitrogen containing high-dielectric-constant insulating film 103 and a silicon oxide film 102, which is formed by making nitrogen localized in the upper layer section of a high-dielectric-constant thin film made of either metal oxide or metal silicate so as to form the nitrogen containing high-dielectric-constant insulating film 103 and then inserting an extra thin interfacial oxide film layer (a silicon oxide film 102) between this thin film and the silicon substrate 101.

First, the effects of the gate insulating film structure shown in FIG. 1 are described below. The addition of nitrogen to metal oxide or metal silicate can improve thermal stability of the high-dielectric-constant thin film. Further, thermal stability of the interface between the high-dielectric-constant thin film and the silicon substrate can be improved by laying the extra thin silicon oxide film 102 on the interface between the high-dielectric-constant thin film and the substrate. Meanwhile, because the nitrogen presence at a high concentration is localized in the upper section of the high-dielectric-constant thin film, the dopant penetration from the gate electrode can be well suppressed. As regards electric characteristics of the interface with the silicon substrate, since the high-dielectric-constant film does not come into direct contact with the silicon substrate but the extra thin silicon oxide film is laid therebetween, and nitrogen in the film is absent on the interface of the silicon substrate so that interfacial defect density can be reduced and the deterioration of the mobility and the reliability, suppressed.

Further, there are various other methods considered possible to use as a manufacturing method of a gate insulating film of the present invention, and the method wherein the high-dielectric-constant film is selectively nitrided by irradiation with a nitrogen containing plasma as described below, and the method in which nitrogen is introduced and its profile is controlled by the step of oxidizing a layered structure of a metal layer and a nitrogen containing layer are, for example, proved to be satisfactory.

In the first method making use of plasma irradiation, a gate insulating film (without nitrogen introduction) comprising a high-dielectric-constant insulating film is formed on a silicon substrate and the irradiation with active nitrogen formed by plasma is applied thereto. For instance, it is possible to form a high-dielectric-constant film made of metal oxide or metal silicate and irradiate the surface of this high-dielectric-constant insulating film with a nitrogen containing plasma. Through proper adjustments of the conditions for the plasma generation, active nitrogen which is highly reactive with elements constituting the gate insulating film or the high-dielectric-constant insulating film can be supplied. This enables the reaction between nitrogen and the above element to proceed speedily, and suppressing the nitrogen diffusion into the gate insulating film, prevents nitrogen from reacting the silicon substrate so that only the film surface (or the region other than the interface with the silicon surface) can be selectively nitrided. In other words, the nitrogen profile can be localized in a region (the surface side) at a distance from the silicon substrate interface.

Figure 2:
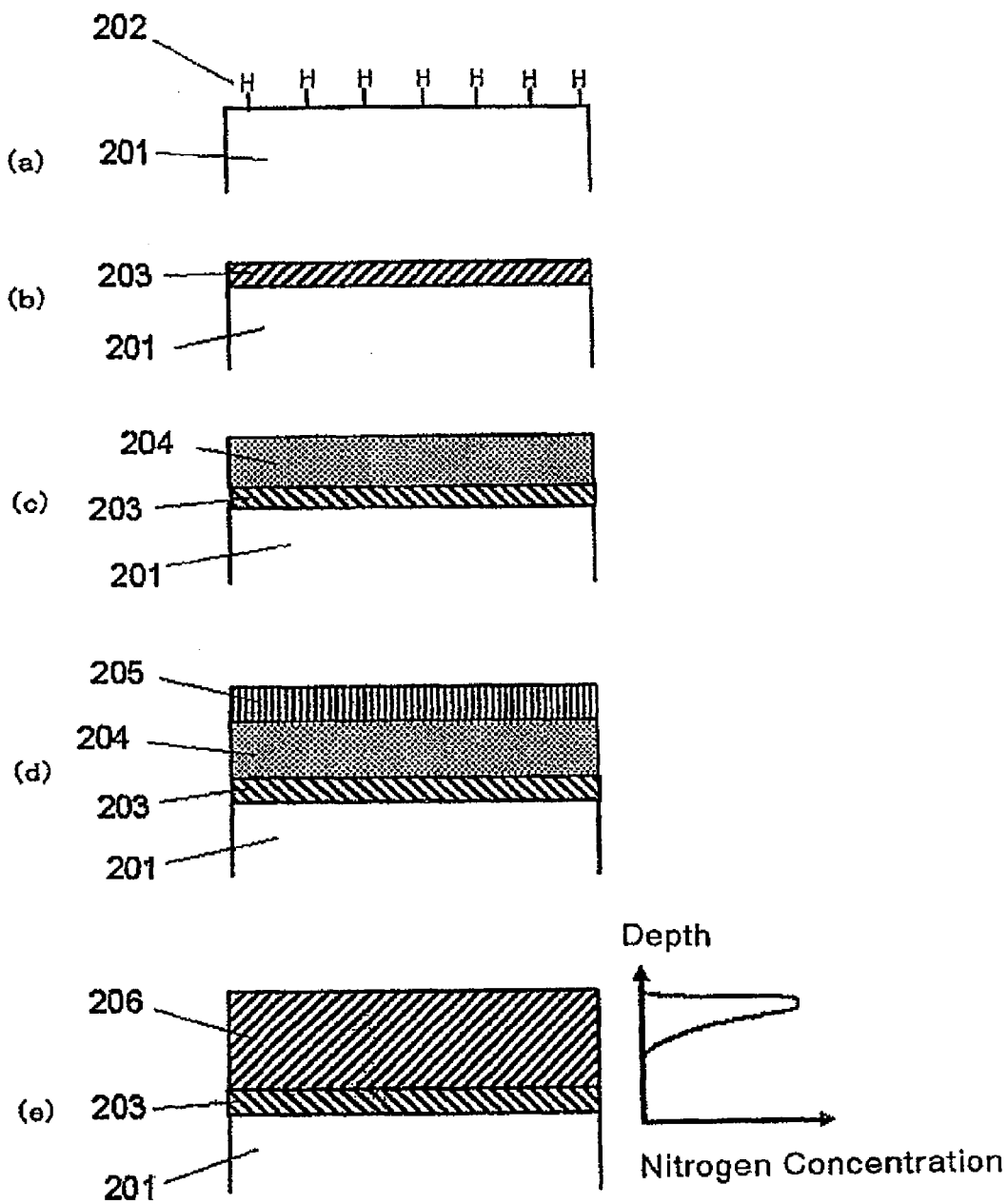
FIG. 2 is a flow diagram showing one embodiment of a manufacturing method of a semiconductor device according to the present invention.

Further, in the second manufacturing method, the nitrogen concentration profile in the film can be controlled by the oxidation treatment of the layered structure shown in the flow diagram of FIG. 2. For instance, after an extra thin silicon oxide film 203 is formed on the surface (hydrogen terminal surface 202) of a silicon substrate 201 (FIG. 2(b)), a metal layer 204 that is a layer made of metal is grown on the surface of this oxide film (FIG. 2(c)). Following that, after a metal nitride layer is grown as a nitrogen containing layer 205 that is a layer containing nitrogen on the top of the metal layer and a layered structure is fabricated (FIG. 2(d)), a heat treatment is applied thereto in the oxygen atmosphere, which enables the metal layer to be oxidized and at the same the nitrogen concentration in the high-dielectric-constant insulating film to be localized in the vicinity of the surface layer. In this way, a nitrogen containing high-dielectric-constant insulating film 206 having such a nitrogen concentration profile as shown in FIG. 2(e) can be obtained, whereby a gate insulating film composed of the nitrogen containing high-dielectric-constant insulating film 206 and the silicon oxide film 203 can be formed. For the nitrogen-containing layer, herein, the use of nitride film or a silicon nitride film (a oxynitride film) of a metal element capable to constitute metal oxide is effective. Further, as a method well-suited to grow metal nitride, the reactive sputtering method with a metal nitride target or a metal target can be given.

The thickness of the nitrogen containing layer is preferable to be not less than 1 nm from the viewpoint of suppressing the dopant diffusion, but not greater than 2 nm on the ground that an unduly large amount of nitrogen does not provide such a large effect as increased in proportion to the amount of added nitrogen.

The conditions of the oxidation treatment may be appropriately determined depending on the material, but the temperature can be set at 500 to 900° C., for instance.

After the gate insulating film is formed on the silicon substrate as described above, agate electrode is formed thereon by a known method and thereby a semiconductor device of the present invention may be obtained.

In the structure of a semiconductor device of the present invention, the addition of nitrogen into the gate insulating film comprising a high-dielectric-constant film improves the thermal stability, suppresses the penetration of dopants from the gate electrode side and, at the same time, overcomes the problems of poor mobility and deterioration of the reliability by keeping nitrogen in the gate insulating film away from the silicon substrate interface and restricting the presence of nitrogen to the film surface or the central section therein.

Figure 3:
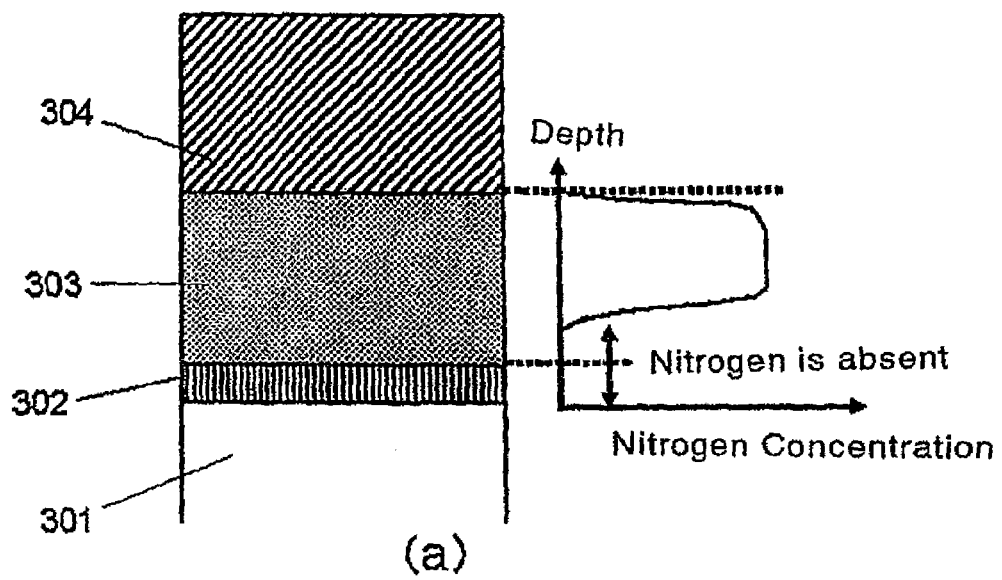
FIG. 3 is a schematic view showing another embodiment of a semiconductor device according to the present invention. Further.
Figure 3:
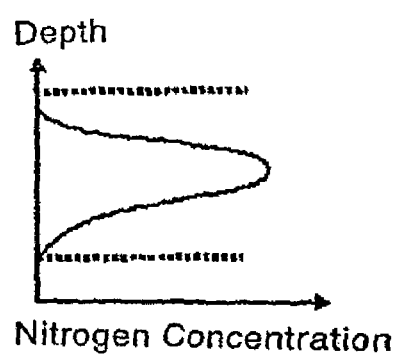
Figure 3:
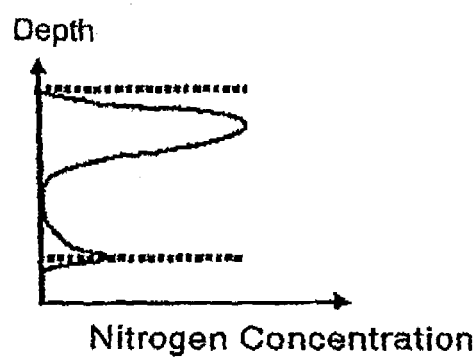

The nitrogen distribution in the gate insulating film which provides the above effects is not limited to the profile shown in the schematic view of FIG. 1, and various profiles shown in FIG. 3 are also found to be effective. FIG. 3(a) illustrates a case that nitrogen is distributed almost uniformly in one section of the high-dielectric-constant insulating film 303, wherein nitrogen concentration rapidly drops on the interface between the high-dielectric-constant film and the silicon oxide film 302 which is laid on the interface between the high-dielectric-constant insulating film and the silicon substrate 301, and nitrogen is absent in the silicon oxide film 302 which is inserted on the interface. FIG. 3(b) shows a case that the maximum of the nitrogen concentration is situated in the central section of the high-dielectric-constant insulating film (the presence of nitrogen is restricted to its central section) and, in this case, too, the nitrogen concentration rapidly drops towards the interface between the high-dielectric-constant film and the silicon oxide film and nitrogen is absent on the interface with the silicon substrate. Further, FIG. 3(c) with a profile shape indicating that nitrogen presence is localized to the surface side (the gate electrode side) if the high-dielectric-constant insulating film presents a case that some nitrogen has segregated on the interface between the high-dielectric-constant film and the silicon oxide film, owing to the nitrogen diffusion in the high-dielectric-constant insulating film or such. If the distance between the interface between the silicon oxide film and the silicon substrate and the region to which nitrogen presence is localized is less than 1 nm, such a case is certainly disadvantageous because, under certain circumstances, fixed charges on the interface, resulting from the nitrogen presence, may lead to the deterioration of the mobility and the reliability. However, when the region where nitrogen is localized (the maximum value of the nitrogen concentration in the direction of the film thickness within nitrogen containing high-dielectric-constant insulating film) is at a distance of preferably not less than 0.5 nm and more preferably not less than 1 nm from the silicon substrate, and besides the nitrogen concentration in the vicinity of the silicon surface interface is sufficiently low, the structure shown in FIG. 3(c), not to mention FIG. (1), FIG. 3(a) and (b), can provide an excellent semiconductor device. Although the permissible nitrogen concentration on the silicon substrate interface obviously depends on the acceptable degree of the mobility deterioration and the reliability deterioration for a particular element (the device design), it is, in this instance, preferable that the nitrogen concentration on the silicon substrate interface of the gate insulating film is less than 3 atomic % from the viewpoint of the interfacial electric characteristics and more preferable that none of nitrogen is present on the substrate interface, at all. Further, the maximum nitrogen concentration in the gate insulating film is preferable to attain not less than 1 atomic % to attain thermal stability and the suppressing effect of the dopant penetration. On the other hand, the maximum nitrogen concentration in the film is preferably less than 20 atomic %, viewed from the point of insulation characteristics and the reliability of the gate insulating film. Nevertheless, the range of nitrogen concentration is closely related to the design of element characteristics and not limited to the above range.

When a silicon oxide film is first formed on the surface of the silicon substrate and thereafter a layered structure made of a metal layer and a nitrogen containing layer is formed thereon and an oxidation treatment is applied thereto to form a gate insulating film, the film thickness of this silicon oxide film is set to be preferably less than 1 nm with the view of reducing the film thickness of the gate insulating film in terms of the silicon oxide film thickness for a given physical film thickness thereof, but preferably not less than 0.5 nm from the viewpoint of interfacial electric characteristics.

With respect to the film thickness of the nitrogen containing high-dielectric-constant gate insulating film, although varying with circumstances, for example, it is considered that, from the viewpoint of preventing a rapid increase in existing leakage current level, the physical film thickness of the gate insulating film is preferably set to be not less than 1.5 nm, and the present invention can well apply to such a gate insulating film. When the position of the maximum nitrogen concentration in the direction of the film thickness is set at a distance of not less than 0.5 nm from the silicon substrate, the gate insulating film requires, as a necessity, a film thickness exceeding 0.5 nm.

Further, examples of the material for the high-dielectric-constant insulating film where nitrogen is to be introduced include $ZrO_2$, $HfO_2$, $Ta_2O_5$, $Al_2O_3$. $TiO_2$, $Nb_2O_5$, rare-earth element oxides such as $Sc_2O_3$ and $Y_2O_3$, oxides of lanthanoid type elements such as $La_2O_3$, $CeO_2$, $Pr_2O_3$, $Nd_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, $Lu_2O_3$ and, in addition, silicate materials which are formed by adding silicon to these above metal oxides.

Further, apart from the structures as shown in afore-mentioned FIG. 1 to FIG. 3 wherein an extra thin silicon oxide film is laid on the interface between a high-dielectric-constant insulating film and a silicon substrate, with the view of improving interfacial electric characteristics, there can be given, effectively, another structure comprising an extra thin silicon oxide film laid on the top of a high-dielectric-constant insulating film in order to improve electric characteristics of the interface with a gate electrode (for example, a polysilicon electrode or a polysilicon germanium electrode) that is to be set on the top of a gate insulating film, wherein a silicon oxide film layer on the surface side (on the gate electrode side) (or in a region at a distance from the silicon substrate interface) can be selectively nitrided. In this case, the gate insulating film has, for instance, a layered structure having, from the silicon substrate side, a first silicon oxide film, a film made of either metal oxide or metal silicate and a second silicon oxide film, and nitrogen is introduced only into the second silicon oxide film, while no nitrogen is introduced into the first silicon oxide film or the film made of either metal oxide or metal silicate.

The film thickness of the above first and second silicon oxide films are both preferably set to be not less than 0.5 nm from the viewpoint of improving interfacial electric characteristics, but not greater than 1 nm with the view of reducing the film thickness of the gate insulating film in terms of the silicon oxide film thickness for a given physical film thickness thereof. Further, the film thickness of the afore-mentioned film made of either metal oxide or metal silicate is preferably set to be not less than 2 nm from the viewpoint of suppressing the tunneling current but not greater than 5 nm, for the sake of convenience in production and proportion in the form of the semiconductor device.

Further, apart from the afore-mentioned layered structures made of a silicon oxide film/a high-dielectric-constant insulating film/a silicon oxide film with clear interfaces, a structure wherein the composition in a metal silicate thin film moderates in the direction of the film thickness and the silicon component is raised in an upper layer section and a lower layer section of the gate insulating film as described in Japanese Patent Application Laid-open No. 358225/2001, and only the region on the surface side where the silicon concentration is high is selectively nitrided demonstrates its effect. In this gate insulating film structure, the gate insulating film comprises a nitrogen containing high-dielectric-constant insulating film which has a structure in which nitrogen is introduced into metal silicate, the composition in the nitrogen containing high-dielectric-constant insulating film continuously varies in the direction of the film thickness, and the silicon concentration has the minimum value in the middle section lying between a silicon substrate side interface of the nitrogen containing high-dielectric-constant insulating film and the other gate electrode side interface thereof, and nitrogen is introduced only into a region lying between the position at which the silicon concentration has the minimum value and the gate electrode side interface, and none of nitrogen is introduced into a region lying between the position where the silicon concentration has the minimum value and the silicon substrate side interface. In such a structure, because the concentration of the metal element in metal silicate increases in the middle section, and the silicon component increases in an upper layer section and a lower layer section of the film, on the both of boundaries of the gate insulating film with the silicon substrate (the lower side interface) and with the gate electrode (the upper side interface), structures similar to the $SiO_2$/Si interface can be each formed, and interfacial electric characteristics can be improved. Further, although the silicate material with a high metal concentration is known to have a disadvantage of having a relatively low crystallizing temperature, its thermal stability can be heightened by forming a structure in which this metal high concentration region is placed between two silicon high concentration regions which have high thermal stability.

When the nitrogen containing high-dielectric-constant insulating film in which the composition of metal silicate varies in the direction of the film thickness is considered to be divided into three layer-shaped regions, that is, from the side of the silicon substrate, a first region, a middle region and a second region, (a first region is in contact with the silicon substrate and the second region, the gate electrode), there can be given, as an example of the above structure, an embodiment wherein the silicon concentration in metal silicate decreases continuously from the silicon substrate side interface in the first region, and takes the minimum value and immediately afterwards starts to increase in the middle region, and then continues to increase up to the interface on the gate electrode side in the second region, while the silicon/metal element ratio in the first and second regions are higher than the average value for the whole gate insulating film and the silicon/metal element ratio in the middle region is lower than the average value for the whole gate insulating film, and nitrogen is introduced only into the second region only. In such a case, the thickness of the first and the second regions are both preferably set to be not less than 0.5 nm from the viewpoint of improving interfacial electric characteristics, but not greater than 1 nm with the view of reducing the film thickness of the gate insulating film in terms of the silicon oxide film thickness for a given physical film thickness thereof. Further, the thickness of the middle region is preferably set to be not less than 2 nm from the viewpoint of suppressing the tunneling current but not greater than 5 nm, for the sake of convenience in production and proportion in the form of the semiconductor.

Further, in introducing nitrogen into the high-dielectric-constant insulating film or the silicon oxide film, there can be considered several types of bonding styles (metal-nitrogen bond, silicon-nitrogen bond and oxygen-nitrogen bond) with any of the metal element constituting the metal oxide or the metal silicate layer and silicon in silicate as well as silicon and oxygen constituting the silicon oxide films inserted on the upper layer or the lower layer of the high-dielectric-constant film. A substance held by bonds between a metal atom and a nitrogen atom, out of these bonds, provide, in most cases, relatively poor insulation so that, in introducing nitrogen into the film, it is preferable to form a structure wherein silicon atoms are selectively nitrided, by preventing the metal-nitrogen bonds to be formed too many. However, as far as Al is concerned, because aluminium nitride (AlN) is a material capable to provide a good insulation, any consideration is unnecessary in this respect when the nitridation treatment for the $Al_2O_3$ material is made. In a structure wherein silicon atoms are selectively nitrided, there certainly exist more silicon-nitrogen bonds than metal-nitrogen bonds.

In the case that agate insulating film (without nitrogen introduction) comprising a high-dielectric-constant insulating film is formed on a silicon substrate and an irradiation with a nitrogen containing plasma is applied thereto, for example, when either a layered structure having a silicon oxide film and a high-dielectric-constant thin film made of metal oxide or a metal silicate thin film is subjected to a plasma nitridation treatment, it is possible to nitride only silicon atoms in the film (especially on the film surface side) through appropriate adjustments of the conditions for the plasma irradiation.

EXAMPLES

Examples of a semiconductor device having a high-dielectric-constant gate insulating film structure in accordance with the present invention and a manufacturing method thereof are described below.

Example 1

In the First Example of the present invention, the results of nitrogen introduction made by an irradiation of nitrogen radicals into an $Al_2O_3$ film grown by the Atomic Layer Chemical Vapor Deposition (ALD) method are described.

On a silicon wafer, a field region of MOSFET was formed beforehand and, in this region, a silicon oxide film with a thickness of 0.6 nm was formed as an underlying oxide film (an interface oxide film). After an $Al_2O_3$ film with a thickness of 4 nm was grown on this wafer by the ALD method in which Al(CH$_3$)$_3$ and H$_2$O source gasses were supplied therefor alternatively, irradiation with nitrogen radicals was applied to this surface. The radical irradiation was made by a vacuum apparatus carrying an ECR (Electron Cyclotron Resonance) radical source as a plasma source. The radical source was disposed directly 20 cm above from the wafer and the conditions for the nitrogen radical irradiation was set such that the substrate temperature was 300 to 700° C., the pressure, 0.3 to 0.9 Pa and the electric power, 150 W, and thereunder the nitridation treatment was carried out for 30 minutes.

Figure 4:
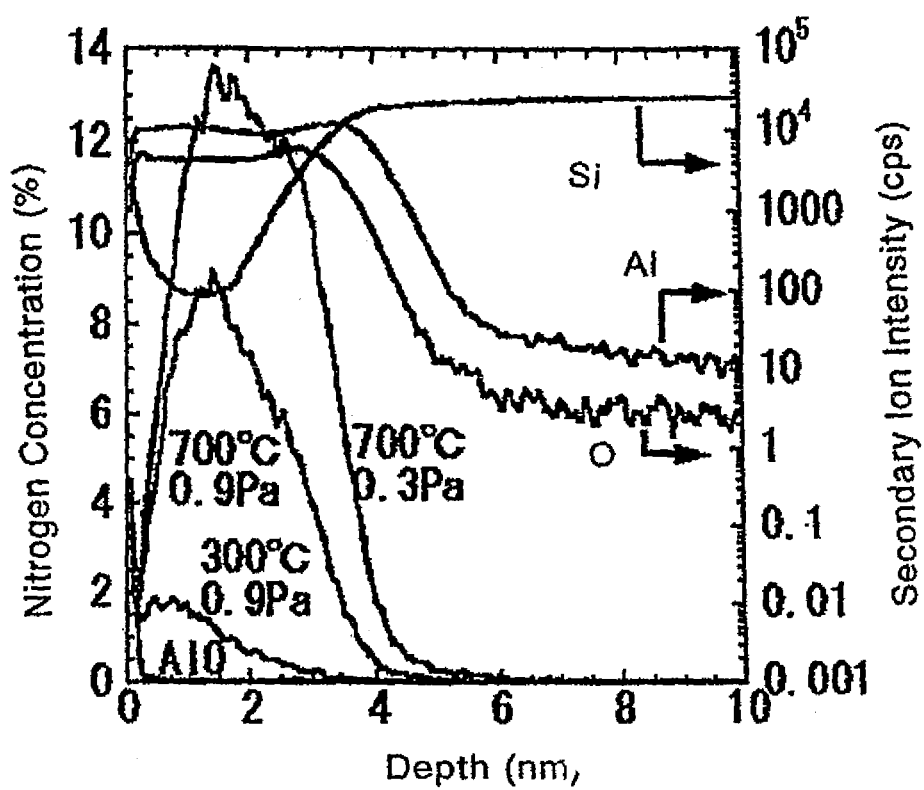
FIG. 4 is a graph showing the results of the measurements of the nitrogen profile in the $Al_2O_3$ film (the results of the secondary ion mass spectroscopy) with nitrogen being introduced into the film by the nitrogen plasma irradiation.

FIG. 4 shows the analyzed results of secondary ion mass spectroscopic measurements for the nitrogen concentrations in the Al$_2$O$_3$ films for which nitridation was carried out under typical but various conditions for the radical irradiation. These results demonstrate that when the film was nitrided under the condition that the substrate temperature was high and the nitrogen gas pressure was low (700° C., 0.3 Pa), nitrogen was distributed throughout the whole film and even introduced to the interface at a high concentration, while in the case that the condition employed was that the substrate temperature was low and the nitrogen gas pressure was high (300° C., 0.9 Pa), the nitrogen concentration in the film decreased but the nitrogen profile obtained showed localization on the surface side. Therefore, it is possible to regulate the amount of the nitrogen introduced into the film through the substrate temperature and besides localize the nitride concentration in the film on the film surface side by setting the nitrogen gas partial pressure optimal (in the above case, a higher pressure).

Using these films subjected to the nitridation treatment as the high-dielectric-constant gate insulating films and polysilicon doped at high concentration as gate electrodes, MOSFETs were fabricated, and it was confirmed that all the samples show an improvement on thermal stability and clear effect of suppressing dopant penetration. Further, the mobility evaluation for these transistors established that the mobility for the transistor (condition for nitridation: 300° C., 0.9 Pa) having a gate insulating film structure in which nitrogen is localized on the surface side of the Al$_2$O$_3$ film increased by approximately 20% in comparison with that of the transistor (condition for nitridation: 700° C., 0.3 Pa) with a gate insulating film having a high nitrogen concentration on its interfaces.

Example 2

In the Second Example, the nitridation treatment was made by irradiating hafnium silicate (HfSiO) with a nitrogen plasma.

On a silicon wafer, a field region of MOSFET was formed beforehand and, in this region, a silicon oxide film with a thickness of 0.6 nm was formed as an underlying oxide film (an interface oxide film). A silicate film with a thickness of 3 nm containing 10 atomic % of Hf was formed thereon, and, using an RCR plasma source, active nitrogen formed from nitrogen gas was applied thereto. The condition for irradiation was that the substrate temperature was 300° C., the nitrogen partial pressure, 6.7 Pa and the additional power supply, 60 W for 1 minute. Resulting from this, a silicate film containing 10 atomic % of nitrogen was obtained.

Figure 5:
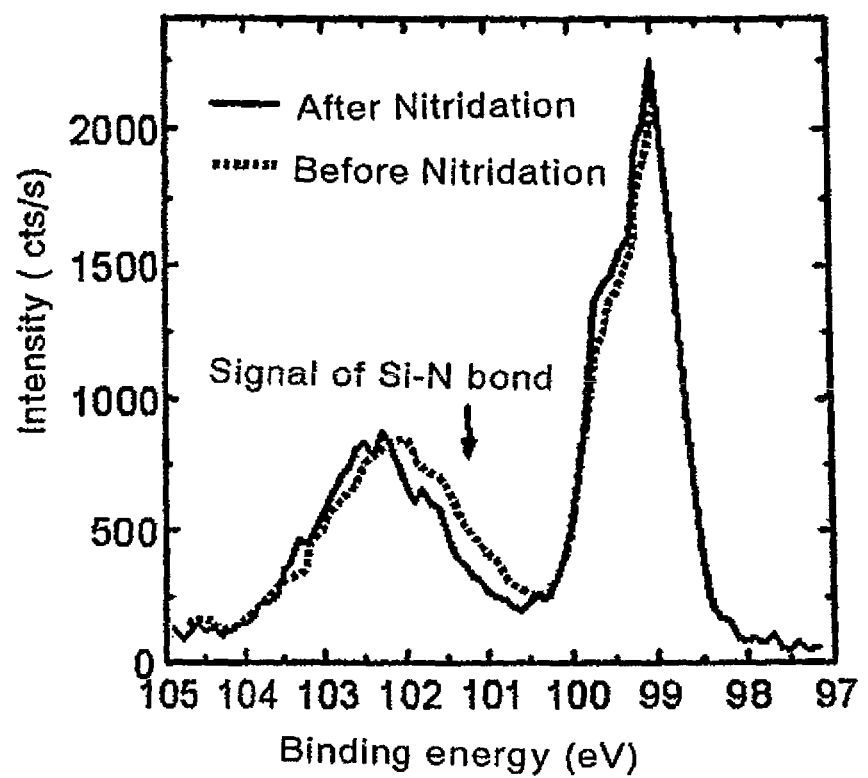
FIG. 5 is a graph showing the bonding state analysis for the surface of the hafnium silicate subjected to the plasma nitridation treatment, obtained by the X-ray photoelectron spectroscopy.

The secondary ion mass spectroscopic measurements were made as in First Example, and it was observed that nitrogen distribution in the film had a peak at a position 0.5 nm away from the film surface side and that the nitrogen content gradually decreased with increasing depth and nitrogen was absent on the interface with the silicon substrate. X-ray photoelectron spectra (Si 2p core level spectra) of a Hf silicate film of the present example, before and after the plasma irradiation are shown in FIG. 5. In this result, the peak at 102.5 eV associated with silicate is shifted towards the lower binding energy side by the nitridation treatment. This indicates the formation of the Si—N bond in the film. Meanwhile, the Hf 4f spectrum shows no change and appears at the normal position of hafnium silicate after the nitridation, which confirms that no Hf—N bond was formed in the film. These results demonstrate that silicon atoms of hafnium silicate on the surface side were selectively nitrided by the nitridation treatment described above. When a MOSFET with this hafnium silicate film as agate insulating film was fabricated, as the formation of the Hf—N bonds were suppressed in the step of selective nitridation, any increase in leakage current was not detected, compared with a transistor with untreated hafnium silicate (that is, without nitrogen introduction). Further, an improvement on thermal stability by the effects of nitrogen introduction was observed (crystallization temperature was improved by 100° C. or more), while the deterioration of the mobility or the reliability, which often accompanies the nitrogen introduction was not.

Moreover, the effect of suppressing the dopant penetration from polysilicon gate was established. In the present example, the Si—O bonds in the silicate film were selectively substituted to the Si—N bonds and, as a result, nitrogen was successfully contained in the silicate film without increasing the leakage current and, at the same time, the nitrogen introduction had an effect of increasing the dielectric constant (the average dielectric constant of the silicate film increased from 10 to 12). Further, when zirconium silicate and lanthanum silicate, instead of hafnium silicate, were in the same fashion nitrided, similar effects were obtained.

Example 3

Figure 6:
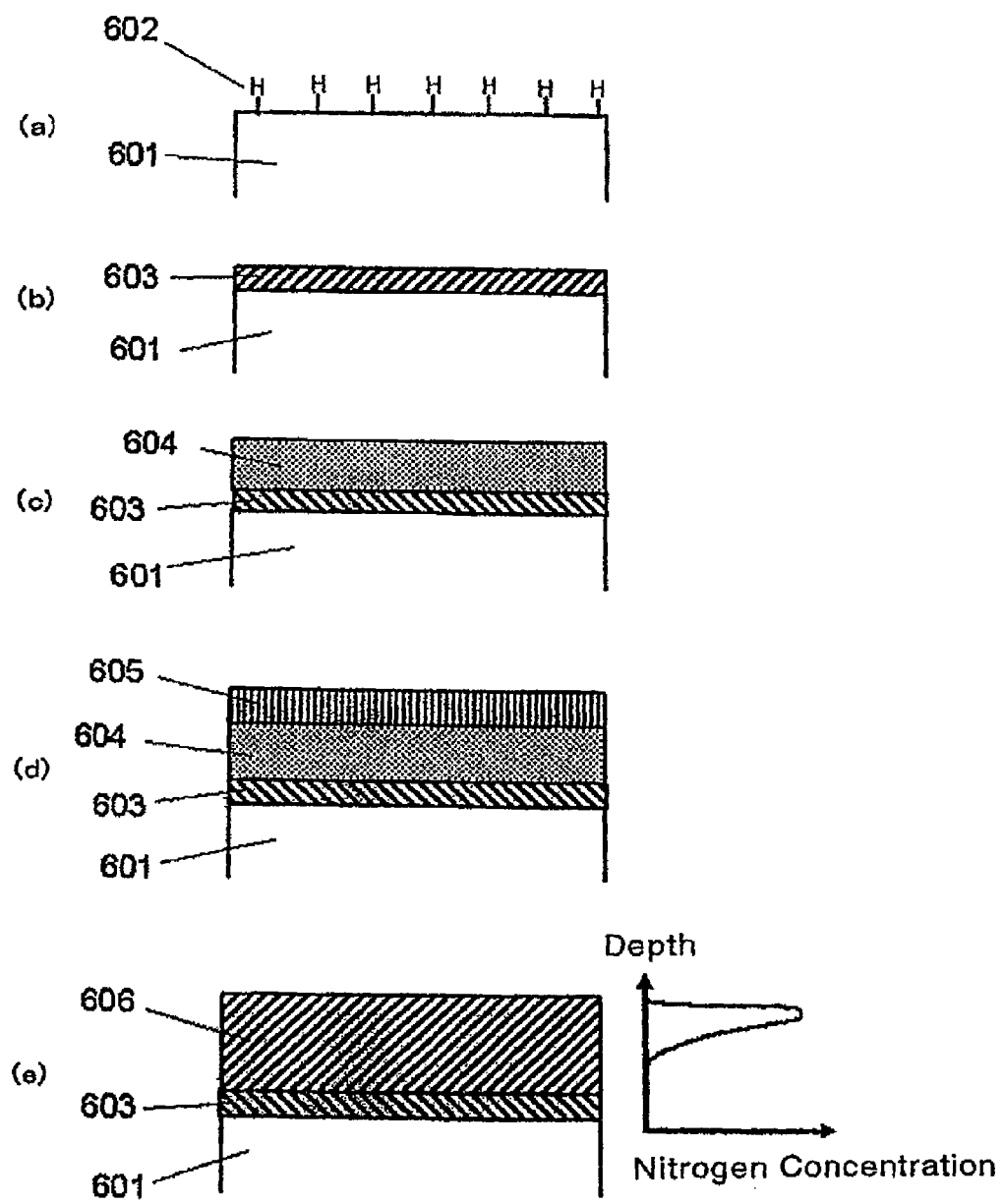
FIG. 6 is a flow diagram showing another embodiment of a manufacturing method of a semiconductor device (a manufacturing method of a gate insulating film structure which comprises an oxidation treatment applied to a layered structure having a metal nitride layer) according to the present invention.

In the Third Example of the present invention, referring to a flow diagram of FIG. 6, there is described an example in which nitrogen addition was made to a ZrO$_2$ high-dielectric-constant thin film with an extra thin silicon oxide film being laid on the silicon substrate interface thereof.

After cleaning a silicon wafer 601, a chemical oxide film formed on the substrate surface was peeled off by a treatment with a hydrofluoric acid solution to make the silicon surface terminate with hydrogen atoms (FIG. 6(a)). This wafer was then subjected to an oxidation treatment in the low pressure oxygen atmosphere at 5 Torr (670 Pa) and 700° C. to form a silicon oxide film 603 with a thickness of 0.6 nm (FIG. 6(b)). A metal layer and a nitrogen-containing layer were then grown on the surface of this oxide film, using a sputtering system equipped with a plurality of targets. For the sputtering deposition, the low damage deposition method making use of the ECR (Electron Cyclotron Resonance) discharge was employed, and argon gas was used as the sputtering gas, and the gas pressure and high frequency output were set to be 5×10$^{-4}$ Torr (0.067 Pa) and 100 W, respectively. After a metal Zr layer 04 was grown to a thickness of 2 nm on the aforementioned silicon oxide film 603 with the substrate temperature set at the ambient temperature, (FIG. 6(c)), a ZrN layer 605 was grown to a thickness of 1.0 nm with targets exchanged and the substrate temperature set at the ambient temperature, whereby a layered structure of ZN/Z/SiO$_2$ was formed (FIG. 6(d)). The oxidation treatment of this sample was conducted in the low pressure oxygen atmosphere at 1 Torr (130 Pa) and 500° C. The metal layer (the metal nitride layer) was converted into a ZrO$_2$ (ZrON) layer by the oxidation treatment, whereby a high-dielectric-constant insulating film (ZrON high-dielectric-constant film) 606 containing nitrogen was obtained. Analysis of the composition distribution in the direction of the film thickness by the secondary ion mass spectroscopy revealed that nitrogen was localized around a position 0.6 nm away from the film surface and the maximum nitrogen concentration was 10 atomic %. Further, it was confirmed that the $SiO_2$ composition was maintained on the interface with the silicon substrate.

After that, by forming a polysilicon electrode on a gate insulating film having the silicon oxide film 603 and the high-dielectric-constant insulating film 606 fabricated by the above method, a MOSFET was fabricated. With the gate insulating film capacitance as well as the current-voltage characteristics being measured for this MOSFET device, its film thickness in terms of the silicon oxide film thickness was 1.4 nm, and the value of the leakage current through the gate insulating film was found to be lowered by approximately three orders of magnitude, compared with the silicon oxide film with the corresponding film thickness. Further, the crystallization temperature of the gate insulating film layer was improved by 150° C. or more, compared with that without nitrogen addition. Further, a heat treatment carried out at 1050° C. in the step of activating the dopants did not lead to the abnormality in the characteristics of the transistor operation which tends to arise accompanying the dopant penetration.

Example 4

In the Fourth Example, after a $ZrO_2$ film in which nitrogen was localized on the surface side was fabricated by the same method as in the Third Example, a polysilicon germanium electrode was formed as a gate electrode. In comparison with the Third Example (a polysilicon gate electrode), a decrease in depletion of the gate electrode and an increase in ON-current of the transistor were attained thereby.

Example 5

Figure 7:
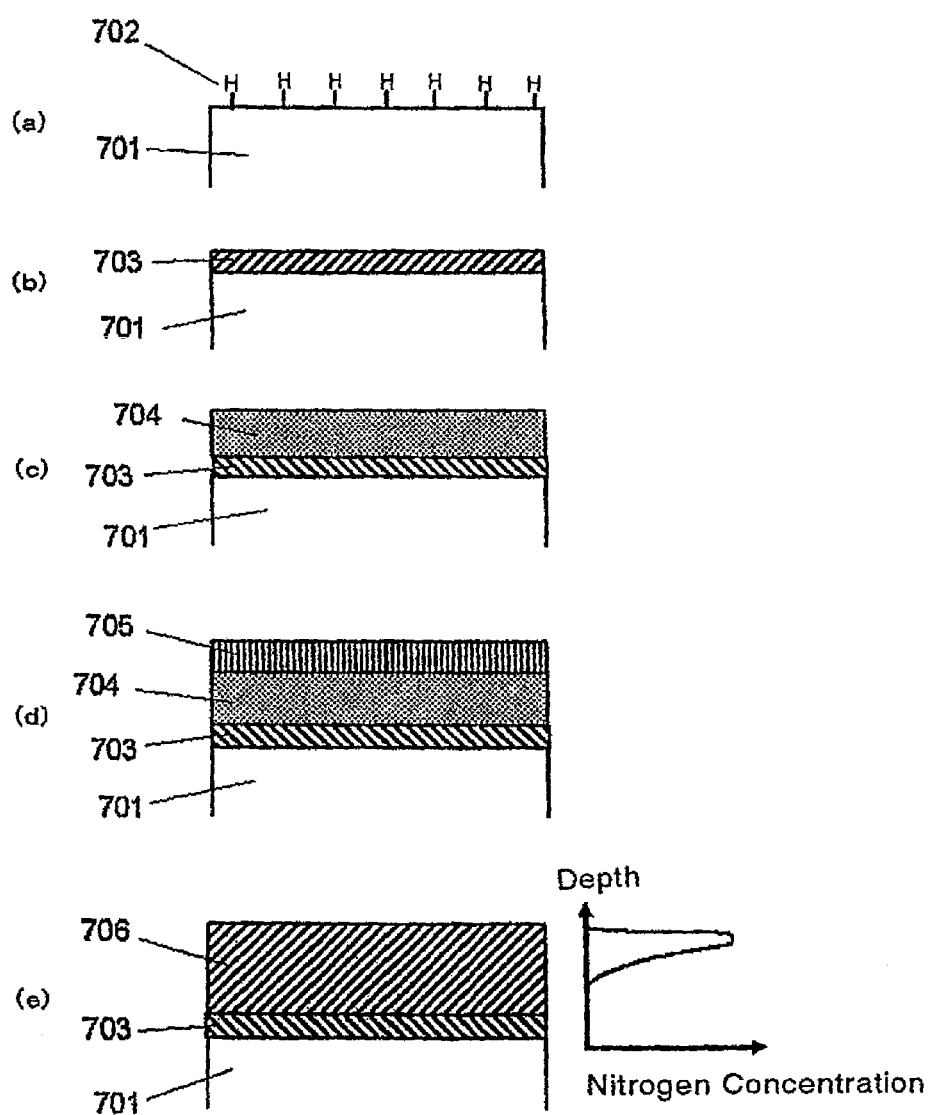
FIG. 7 is a flow diagram showing another embodiment of a manufacturing method of a semiconductor device (a manufacturing method of a gate insulating film structure which comprises an oxidation treatment applied to a layered structure having a silicon nitride film) according to the present invention.

In the Fifth Example, nitrogen addition was made through a silicon nitride film into a Hf silicate high-dielectric-constant thin film wherein a silicon oxide film was laid on a silicon substrate interface (FIG. 7).

As in the Third Example, after cleaning a silicon wafer 701 and peeling off a chemical oxidation film (FIG. 7(a)), a silicon oxide film 703 with a thickness of 0.6 m, was formed (FIG. 7(b)). On the surface thereof, an amorphous HfSi layer 704 with a physical thickness of 2 nm was formed by means of the sputtering deposition with a sintered HfSi target (FIG. 7(c)). The condition for the sputtering deposition was the same as in the Second Example. After that, on the surface of this wafer, a silicon nitride film 705 with a thickness of 0.5 nm was grown by means of the CVD (Chemical Vapor Deposition) using $SiH_4$ and $NH_3$ as source gasses (FIG. 7(d)). The sample was subjected to the oxidation treatment in the low pressure oxygen atmosphere at 1 Torr (130 Pa) and 700° C. to form a nitrogen-introduced hafnium silicate (HfSiO) film 706, whereby a nitrogen containing high-dielectric-constant gate insulating film was formed.

Analysis of the composition distribution of the present sample by the secondary ion mass spectroscopy revealed that although some mixing took place at the atomic layer level due to the interfacial reactions on one interface between the silicon oxide film and the Hf silicate as well as on the other interface on the surface side, that is, between the Hf silicate layer and the silicon nitride film (the silicon oxynitride film), the nitrogen concentration peak has the maximum value of 10 atomic % at a position 0.5 nm away from the surface, and further confirmed that the $SiO_2$ composition was maintained on the interface with the silicon substrate.

Now, a MOSFET device was fabricated by forming a gate electrode on a gate insulating film comprising a silicon oxide film 703 and a hafnium silicate layer 706, which was formed as described above. In this MOSFET, the film thickness of the gate insulating film in terms of the silicon oxide film thickness was found to be 1.6 nm, and the value of the leakage current therethrough, lowered by approximately two orders of magnitude, compared with the silicon oxide film with the corresponding film thickness.

The present invention provides a semiconductor device having simultaneously a plurality of effects such as the improvement on thermal stability of the high-dielectric-constant film, the prevention of the dopant penetration from the gate electrode as well as the prevention of the deterioration of electric characteristics of the interface between the gate insulating film and the silicon substrate, by employing a gate insulating film structure comprising a metal oxide thin film or silicate thin film to which nitrogen addition is applied, the nitrogen distribution therein being kept away from the silicon substrate interface. Further, the present invention provides a manufacturing method capable to fabricate a semiconductor device with a gate insulating film structure comprising such a high-dielectric-constant thin film as described above.

What is claimed is:

1. A semiconductor device, comprising:
    a gate insulating film and a gate electrode stacked in this order;
    wherein said gate insulating film and said gate electrode are in contact with each other; and
    wherein said gate insulating film comprises a silicon oxide film formed on a silicon substrate so as to be in contact therewith, and a nitrogen containing high-dielectric-constant insulating film formed on said silicon oxide film so as to be in contact therewith; and
    wherein said nitrogen containing high-dielectric-constant insulating film which has a structure in which nitrogen is introduced into metal oxide or metal silicate; and
    wherein a nitrogen concentration in said nitrogen containing high-dielectric-constant insulating film has a distribution in a direction of a film thickness; and
    a position at which the nitrogen concentration in said nitrogen containing high-dielectric-constant insulating film reaches a maximum in the direction of the film thickness is present in a region at a distance from the silicon substrate such that a maximum impurity concentration of the nitrogen concentration is greater than a nitrogen concentration at an interface between the silicon oxide film and the nitrogen containing high-dielectric-constant insulating film.

2. The semiconductor device according to claim 1, wherein said position at which the nitrogen concentration in said nitrogen containing high-dielectric-constant insulating film reaches the maximum in the direction of the film thickness is present in the region at the distance of not less than 0.5 nm from the silicon substrate.

3. The semiconductor device according to claim 1, wherein said position at which the nitrogen concentration in said nitrogen containing high-dielectric-constant insulating film reaches the maximum in the direction of the film thickness is localized on a side of the gate electrode in said nitrogen containing high-dielectric-constant insulating film.

4. The semiconductor device according to claim 1, wherein the position at which the nitrogen concentration in said nitrogen containing high-dielectric-constant insulating film reaches the maximum in the direction of the film thickness is localized in a central section of said nitrogen containing high-dielectric-constant insulating film.

5. The semiconductor device according to claim 1, wherein the nitrogen concentration on a silicon substrate side interface of said gate insulating film is less than 3 atomic %.

6. The semiconductor device according to claim 1, wherein the position of the maximum impurity concentration of the nitrogen concentration is present in the region at a distance from the silicon oxide film.

7. The semiconductor device according to claim 1, wherein said silicon substrate and said gate insulating film are in contact with each other, and said gate insulating film and said gate electrode are in contact with each other; and said gate electrode is made of either a polysilicon or a polysilicon germanium conductive film.

8. The semiconductor device according to claim 1, wherein said gate insulating film contains at least one type selected from the group consisting of Zr, Hf, Ta, Al, Ti, Nb, Sc, Y, La, Ce, Pr, Nd, Sm, Eu, Gd, Tb, Dy, Ho, Er, Tm, Yb and Lu.

9. The semiconductor device according to claim 1, wherein the film thickness of said nitrogen containing high-dielectric-constant insulating film is greater than a film thickness of said silicon oxide film.

\* \* \* \* \*